(12) United States Patent  
Motwani

(10) Patent No.: US 9,323,609 B2  
(45) Date of Patent: Apr. 26, 2016

(54) DATA STORAGE AND VARIABLE LENGTH ERROR CORRECTION INFORMATION

(71) Applicant: Ravi H. Motwani, San Diego, CA (US)

(72) Inventor: Ravi H. Motwani, San Diego, CA (US)

(73) Assignee: Intel Corporation, Santa Clara, CA (US)

(*) Notice: Subject to any disclaimer, the term of this patent is extended or adjusted under 35 U.S.C. 154(b) by 84 days.

(21) Appl. No.: 14/080,936

(22) Filed: Nov. 15, 2013

(65) Prior Publication Data

US 2015/0143185 A1   May 21, 2015

(51) Int. Cl.
*G11C 29/00* (2006.01)
*G06F 11/10* (2006.01)
*G11C 29/44* (2006.01)

(52) U.S. Cl.
CPC ............ *G06F 11/1048* (2013.01); *G11C 29/44* (2013.01)

(58) Field of Classification Search
None
See application file for complete search history.

(56) References Cited

U.S. PATENT DOCUMENTS

| 5,233,653 | A | * | 8/1993 | Katsurabayashi | 380/243 |
| 5,535,173 | A | * | 7/1996 | Carre et al. | 365/230.09 |
| 5,996,109 | A | * | 11/1999 | Shikakura | 714/774 |
| 6,067,122 | A | * | 5/2000 | Cahill, III | 348/478 |
| 7,210,077 | B2 | * | 4/2007 | Brandenberger et al. | 714/708 |
| 7,295,764 | B2 | * | 11/2007 | Betti et al. | 386/265 |
| 7,315,970 | B2 | * | 1/2008 | Arakawa et al. | 714/718 |
| 8,432,815 | B2 | * | 4/2013 | Bruckmann et al. | 370/252 |
| 8,595,597 | B2 | * | 11/2013 | Xie et al. | 714/773 |
| 8,732,544 | B2 | * | 5/2014 | Kanno et al. | 714/755 |
| 2002/0029315 | A1 | * | 3/2002 | Williams et al. | 711/105 |
| 2003/0090945 | A1 | * | 5/2003 | Kwon et al. | 365/200 |
| 2008/0072120 | A1 | * | 3/2008 | Radke | 714/768 |
| 2008/0130986 | A1 | * | 6/2008 | Bae et al. | 382/159 |
| 2010/0058125 | A1 | * | 3/2010 | Chen et al. | 714/704 |
| 2011/0320915 | A1 | * | 12/2011 | Khan | G06F 3/0641 714/773 |

* cited by examiner

*Primary Examiner* — Daniel McMahon
(74) *Attorney, Agent, or Firm* — Chapin IP Law, LLC

(57) ABSTRACT

A corresponding portion of storage (such as one or more storage cells) is assigned one of multiple different error correction modes depending on a respective ability of the corresponding portion of storage cells to store data without error. Groups of storage cells that are less prone to failures (i.e., loss of data) are assigned a first error correction mode in which a first length error correction code is used to generate error correction information for a given sized segment of data. Groups of storage cells that are more prone to failures are assigned a second error correction mode in which a second length error correction code is used to generate error correction information for the given sized segment of data.

22 Claims, 11 Drawing Sheets

SETTINGS INFORMATION
150-1

| STORAGE PORTION | E.C.G.S. |
|---|---|
| DEVICE 120-1 ............ | |
| PAGES 1-256 ........ | E.C.MODE #1 |
| PAGES 257-512 ....... | E.C.MODE #2 |
| DEVICE 120-2 ............ | |
| PAGES 1-256 ........ | E.C.MODE #1 |
| PAGES 257-512 ....... | E.C.MODE #2 |

DATA STORAGE AND VARIABLE LENGTH ERROR CORRECTION INFORMATION

BACKGROUND

Memory systems typically include many millions of storage cells to store bits of information. Any of the many storage cells can fail over the useful life of the memory system. Proper management of the failing elements in the memory system is important for longevity and usefulness.

One conventional way to reduce the impact of failing memory bits is to generate error correction information such as error correction codes, parity information, etc., for corresponding data stored in a memory system. In certain instances, the error correction information can be used to restore corrupted data as a result of one or more failing memory cells.

More specifically, according to conventional techniques, a memory system may include a sequence of multiple memory devices to store data. A technique known as data striping can be used to store a respective portion of corresponding data in each of the multiple memory devices in the sequence. In general, in accordance with data striping, a first portion of a data string is stored in a first memory device, a second portion of the data string is stored in a second memory device, a third portion of the data string is stored in a third memory device, and so on.

When storing a corresponding portion of data in a memory device, a data management function generates corresponding error correction information. If desired, the generated error correction information can be stored in the memory device along with the portion of data.

When subsequently reading the portion of data stored in memory device, the data management function can use error correction information to determine whether one or more bits in the portion of data has been corrupted. If so, the data management access function uses corresponding stored error correction information to reconstruct the original data based on a combination of the data read from the memory device and the corresponding error correction information. Thus, upon detecting a condition such as corruption of data stored in a particular device in a sequence of memory devices, the corresponding error correction information stored in the particular device can be used to restore the corrupted data.

BRIEF DESCRIPTION OF THE DRAWINGS

The accompanying drawings, which are incorporated in and constitute a part of this specification, illustrate one or more embodiments described herein and, together with the Detailed Description, explain these embodiments. In the drawings:

FIG. 7 is an example diagram of settings information specifying assignment of different error correction modes according to embodiments herein;

DETAILED DESCRIPTION

Figure 1:
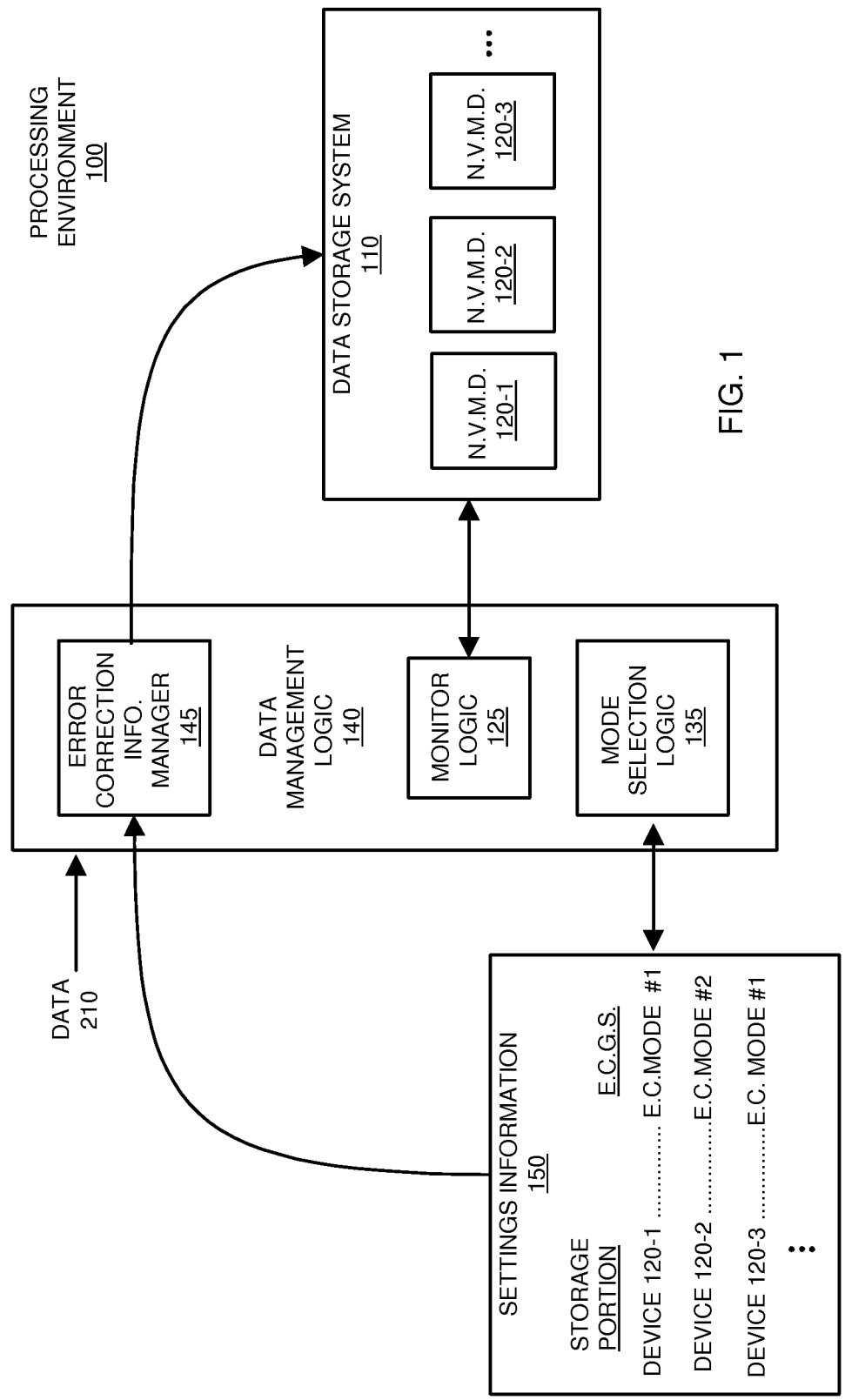
FIG. 1 is a block diagram of an example processor environment and corresponding data management logic configured to implement error correction modes according to embodiments herein.

Memory systems such as those including one or more non-volatile memory devices are prone to failure for a number of reasons. For example, non-volatile memory devices are prone to failures that occur as a result of fabrication defects. Fabrication defects (e.g., extrinsic-type failures) can be caused by: exposure of a die to particles, scratches on the die, etc. Typically, these types of storage cell failures occur earlier in a life of a respective memory device.

Additionally, non-volatile memory systems are also prone to later life type of failures (e.g., intrinsic-type failures). For example, storage cells in memory devices are typically designed to handle repeated (e.g., many thousands of) read/writes. However, a high number of repeated cycles of erasing and writing to the same memory cell can wear out an oxide layer of a floating gate in a cell, resulting in the inability to store data in the corresponding storage cell. Thus, eventually, an excessive number of accesses can cause a respective cell to be prone to failure. A failure occurs when a logic zero is stored in a storage cell and is read back later as a logic one.

Typically, a performance metric known as a bit error rate is used to indicate a corresponding health of a memory device and its ability to store data. For example, early in life, a corresponding nonvolatile memory device typically has a low bit error rate, meaning that very little corresponding data loss, if any, occurs when reading back data previously stored in a memory device.

As the nonvolatile memory device ages, its ability to properly store data diminishes. For example, later in life, for reasons as discussed above, a corresponding nonvolatile memory device typically has a higher corresponding bit error rate of storing data, meaning that significant loss of data more often occurs when reading the data back from memory. In certain instances, the amount of lost data is so significant that corresponding error correction information associated with the data cannot be used to reconstruct a rendition of the original lost data. Thus, even though error correction information may be stored with corresponding data in a memory device, at some point, even the error correction information may be of no help in trying to reproduce lost data as a result of corruption.

Embodiments herein are directed to extending a useful life of a memory system via implementation of novel error correction techniques. For example, as discussed below in more detail, embodiments herein can include assigning a corresponding portion of storage (such as a storage device, block of storage cells in a storage device, page of storage cells, group of storage cells, etc.) one of multiple different error correction modes depending on a respective ability (as indicated by a deduced or actual measured performance metric such as error rate) of the corresponding portion of storage cells to properly store data. Groupings of storage cells that are less prone to data storage failures (i.e., loss of data) are assigned a first error correction mode. Groupings of storage cells that are more prone to data storage failures are assigned a second error correction mode.

In accordance with the first error correction mode, a corresponding data management function generates a first number of error correction bits (such as error correction codes or information of a first length) for corresponding data to be stored in respective assigned storage cells. In accordance with the second error correction mode, the corresponding data management function generates a second number of error correction bits (such as error correction codes or information of a second length) for corresponding data stored in respective assigned storage cells.

As discussed herein, in accordance with one non-limiting example embodiment, fewer error correction bits are needed early in the useful life of a corresponding memory device because fewer errors tend to occur. However, a higher number of correction bits are needed later in the useful life of a corresponding memory device because more errors typically occur. One embodiment herein includes generating variable length error correction codes. Shorter length error correction codes can be used to protect stored data when corresponding storage cells are able to store data at a low bit error rate. Conversely, longer length error correction codes can be used to protect stored data when the corresponding storage cells are able to store data at a higher bit error rate.

Reducing the amount of error correction information to be generated for corresponding data (such as via shorter error correction codes) early in life is useful because more storage cells otherwise used to store generated error correction information instead can be used to store data as opposed to storing error correction information. For highly written-to storage cells more prone to corruption, the allocation of additional storage cells to store more error correction information (such as for longer generated error correction codes) means that a corresponding memory device can be used longer to store data without loss. Thus, variable length error correction code can extend the useful life of a memory system.

Now, more specifically, FIG. 1 is an example diagram illustrating a processor environment including data management logic according to embodiments herein.

As shown, processing environment 100 can include data management logic 140 and data storage system 110. In this example embodiment, data management logic 140 includes monitor logic 125, mode selection logic 135, and error correction information manager 145.

Data storage system 110 can include any suitable number of storage resources such as non-volatile memory device 120-1, non-volatile memory device 120-2, non-volatile memory device 120-3, etc.

By way of a non-limiting example, each of the non-volatile memory devices 120 in data storage system 110 can be any suitable type of resource. For example, the non-volatile memory devices 120 can be any type of non-volatile memory that stores data such, Phase Change Memory (PCM), a three dimensional cross point memory, a resistive memory, nanowire memory, Ferro-electric Transistor Random Access Memory (FeTRAM), flash memory such as NAND or NOR, Magnetoresistive Random Access Memory (MRAM) memory that incorporates memristor technology, Spin Transfer Torque (STT)-MRAM, etc.

By way of a non-limiting example, the data storage system 110 can be a solid state-drive.

The data management logic 140 and its components can be executed via any suitable type of resource such as an ASIC (Application Specific Integrated Circuit), computer processor hardware executing instructions, firmware, hardware, software, etc.

During operation, assume that the data management logic 140 receives data 210 for storage in data storage system 110. In one embodiment, as will be discussed later in this specification, the data management logic 140 stores data 210 as a stripe of data across multiple memory devices in data storage system 110.

Note that as an alternative to striping data, received data 210 can be stored in storage cells of a single memory device in data storage system 110.

Prior to storage of data in data storage system 110 (and potentially prior to receiving data 210), the data management logic 140 assigns one of multiple different error correction modes to corresponding portions of storage cells in data storage system 110.

For example, in one embodiment, the monitor logic 125 monitors an error rate associated with a portion of storage cells in a particular non-volatile memory device in the data storage system 110 to store data. The error rate is a measure of an ability of the storage cells to store data without error. In one embodiment, this can include initiating repeated storage of data (such as via erasing and then writing a pattern of bit information) to a set of storage cells in a corresponding particular non-volatile memory storage device and thereafter verifying an accuracy of the data stored in the storage cells of the particular non-volatile memory device.

Monitoring the ability to store data in corresponding storage cells of data storage device 110 can vary depending on the embodiment. For example, in one embodiment, a suitable portion (such as block, page, etc.) in each of the nonvolatile memory devices 120 can be designated as a test region to test the ability of the memory device 120 to store data. In such an instance, the data management logic 140 repeatedly erases and writes and then subsequently reads stored test data in the designated storage cells many times potentially prior to use of the data storage system 110. During this process, the monitor logic 125 determines how often storage failures occur for the test data. Based on the number of failures, the monitor logic 125 determines an error rate associated with the corresponding device to store data.

Alternatively, or additionally, the monitor logic 125 can be configured to keep track of storage failures that occur during normal use of the data storage system 110 over its life span. For example, when a user of the data storage system 110 stores corresponding data in data storage system 110, the data management logic 140 can produce error correction information. Based on the stored error correction information, the data management logic 140 is able to determine how many data bit errors occur for data stored in corresponding storage cells of the data storage system 110 during a lifetime of use.

Accordingly, embodiments herein can include determining the ability of storage cells in the memory device 120-1 to store corresponding data without errors based on actual detection of storage failures using previously stored error correction information.

In accordance with yet further embodiments, monitor logic 125 can be configured to monitor how many times data is written to a set of storage cells in the data storage system 110 during its life. If the number of cycles of ERASES and WRITES of data to the stored cells is less than a threshold value, then it may be assumed that the storage cells are less prone to failure and have a low bit error rate for storing data. In this first instance, the monitor log 125 assigns a first error correction mode (supporting weak error correction) to corresponding storage cells in the memory device 120-1. On the other hand, if the number of cycles of ERASES and WRITES of data to the stored cells is greater than a threshold value, then it is assumed that the storage cells are more prone to failure and have a higher bit error rate for storing data. In this latter instance, the monitor log 125 would assign the second error correction mode (supporting a higher level of error correction) to the storage cells in the memory device 120-1.

Accordingly, embodiments herein can include deducing an error rate representative of the ability of storage cells to store corresponding data based on a number of cycles of writing data to a particular non-volatile memory device or portions thereof.

Based on the error rate representative of the ability to store data, the mode selection logic 135 selects one of multiple different error correction modes in which to manage corresponding error correction information for subsequently received data to be stored in corresponding storage cells in the non-volatile memory device. In one embodiment, the mode selection logic 135 assigns an appropriate error correction mode to the particular non-volatile memory device or portion thereof.

Assume in this example that nonvolatile memory device 120-1 is able to store data at a relatively low bit error rate because storage cells have been written relatively few times such that storage cells experience a low bit error rate. In such an instance, the mode selection logic 135 assigns a first error correction mode (error correction mode #1) to memory device 120-1. In one embodiment, the first error correction mode specifies a first ratio of generating error correction information for subsequently received data stored in the memory device 120-1.

Assume further in this example that nonvolatile memory device 120-2 is able to store data but has a relatively high bit error rate. In such an instance, in response to detecting the higher bit error rate, the mode selection logic 135 assigns a second error correction mode (error correction mode #2) to memory device 120-2. In one embodiment, the second error correction mode specifies a second ratio of generating error correction information for subsequently received data stored in the memory device 120-2.

As mentioned, mode selection logic 140 can select from any suitable number of error correction modes, each of which generates different amounts error correction information for corresponding amounts of stored data.

In one embodiment, the mode selection logic 135 produces settings information 150 to indicate assignment of error correction modes to a group of storage cells in the data storage system 110. Settings information 150 can be stored in any suitable resource accessible to the data management logic 140.

In this example embodiment, a group of storage cells such as storage cells in the memory device 120-1 is assigned a first error correction mode; a group of storage cells such as storage cells in memory device 120-2 is assigned a second error correction mode; a group of storage cells such as storage cells in memory device 120-3 is assigned a first error correction mode; and so on.

As previously discussed, the groupings of storage cells in data storage system 110 assigned a corresponding error correction mode can vary. For example, all of the stored cells in a respective memory device can be assigned a same error correction mode. As an alternative, different groupings of storage cells in a given memory device can be assigned different error correction modes.

By further way of non-limiting example, the first error correction mode can indicate to generate error correction information for a given quantity of data to be stored in a respective memory device according to a first bit length. In other words, error correction codes generated for corresponding stored data in accordance with the first error correction mode can be a first number of bits in length.

The second error correction mode can indicate to generate error correction information for a given quantity of data to be stored in a respective memory device according to a second bit length, and so on.

In this manner, each of the multiple different error correction modes can include generating corresponding error correction codes of different lengths.

As discussed in more detail in the following figures, data management logic 140 receives data 210 (such as a data string including multiple bits of information). Error correction information manager 145 utilizes settings information 150 to determine which of multiple error correction modes is to be used when storing corresponding data 210 in different regions of data storage system 110.

Figure 2:
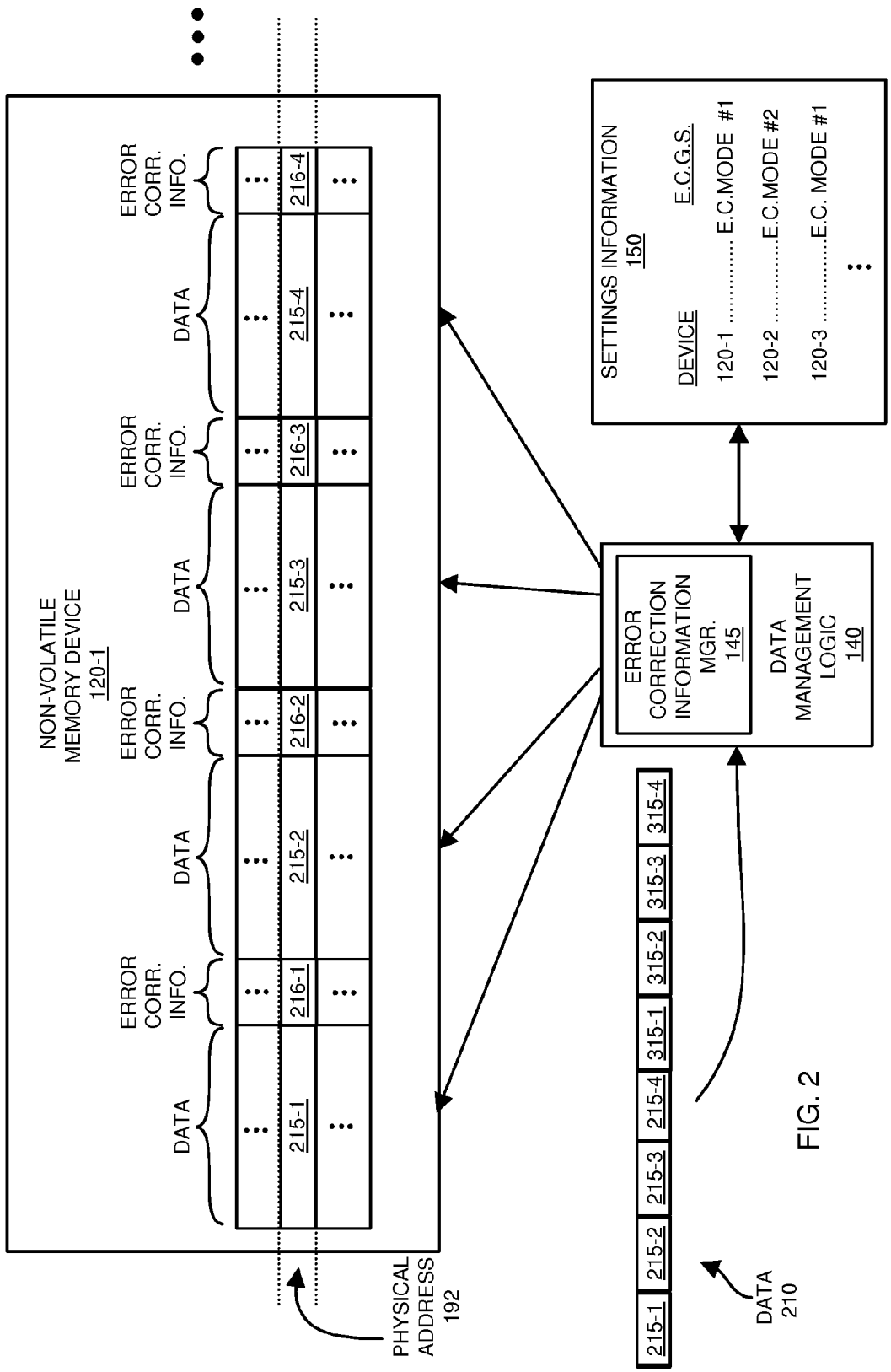
FIG. 2 is an example diagram illustrating storage of data in accordance with a first error correction mode according to embodiments herein.

FIG. 2 is an example diagram illustrating storage of data in accordance with a first error correction mode according to embodiments herein.

As shown, data management logic 140 receives data 210 including multiple bits of data. The data management logic 140 partitions the data 210 into segment 215-1, segment 215-2, segment 215-3, segment 215-4, segment 315-1, segment 315-2, segment 315-3, and segment 315-4.

If desired, each of the segments (portions) can include an equal number of bits. For sake of illustration, assume in this example embodiment that each of segments 215 and 315 includes 4096 bytes of information. Further assume that the data management logic 140 attempts to store segments 215 of data 210 in memory device 120-1 and segments 315 of data 210 in memory device 120-2.

The error correction information manager 105 determines from settings information 150 that memory device 120-1 is assigned the first error correction mode. In response to detecting that the first segment 215-1 is destined for storage in the first non-volatile memory device 120-1, the error correction information manager 145 derives error correction information 216-1 from the segment 215-1 in accordance with the first ratio as specified by the first error correction mode. In this non-limiting example embodiment, assume that the first ratio equals 0.1348 (such as 2208 bytes of error correction information per 16,384 bytes of stored data). In accordance with the first ratio, the error correction information manager 145 generates 552 bytes of error correction information for each segment of 4096 bytes.

Subsequent to generating error correction information 216-1 (such as 552 bytes), the data management logic 140 initiates storage of the segment 215-1 (such as 4096 bytes) and corresponding generated error correction information 216-1 (such as 552 bytes) in memory device 120-1 at physical address 192 of memory device 120-1. By way of a non-limiting example, the segment 215-1 and corresponding can be stored in a contiguous row of storage cells.

Accordingly, embodiments herein include utilizing a first length error correction code (such as 552 bytes) as specified by the first error correction mode to generate and store error correction information for data to be stored in a first region of storage cells in the particular non-volatile memory device.

The data management logic 140 repeats the process of generating error correction information for each segment in data string 210. For example, in a similar manner as discussed above, the error correction information manager 145 produces error correction information 216-2 based on segment 215-2. As shown, the data management logic 140 initiates storage of the segment 215-2 (such as a next 4096 bytes of data) and corresponding error correction information 216-2 (such as 552 bytes) in a next contiguous portion of the page at physical address 192.

The error correction information manager 145 produces error correction information 216-3 based on segment 215-3. As shown, the data management logic 140 initiates storage of the segment 215-3 (such as 4096 bytes) and corresponding error correction information 216-3 (such as 552 bytes) in a next contiguous portion of the page at physical address 192.

The error correction information manager 145 produces error correction information 216-4 based on segment 215-4. As further shown, the data management logic 140 initiates storage of the segment 215-4 (such as 4096 bytes) and corresponding generated error correction information 216-4 (such as 552 bytes) in a next contiguous portion of the page at physical address 192.

In this manner, the data management logic 140 generates error correction information according to the first error correction mode and stores such information in memory device 120-1.

In a reverse manner, when the data management logic 140 reads the page of data stored at physical address 192 of the memory device 120-1, the data management logic 140 accesses settings information 150 to determine which of multiple error correction modes was used to store corresponding data and error correction information. In this example embodiment, when reading from memory device 120-1, the data management logic learns that the memory device 120-1 is assigned the first error correction mode. In accordance with the first error correction mode, the error correction information manager 145 retrieves the segment 215-1 and error correction information 216-1. Using the retrieved error correction information 216-1, the error correction information manager 145 determines which if any bits in segment 215-1 to correct.

In a similar manner, using appropriate stored error correction information, the error correction information manager 145 is able to retrieve and verify accuracy of each segment of data read from the memory device 120-1.

Figure 3:
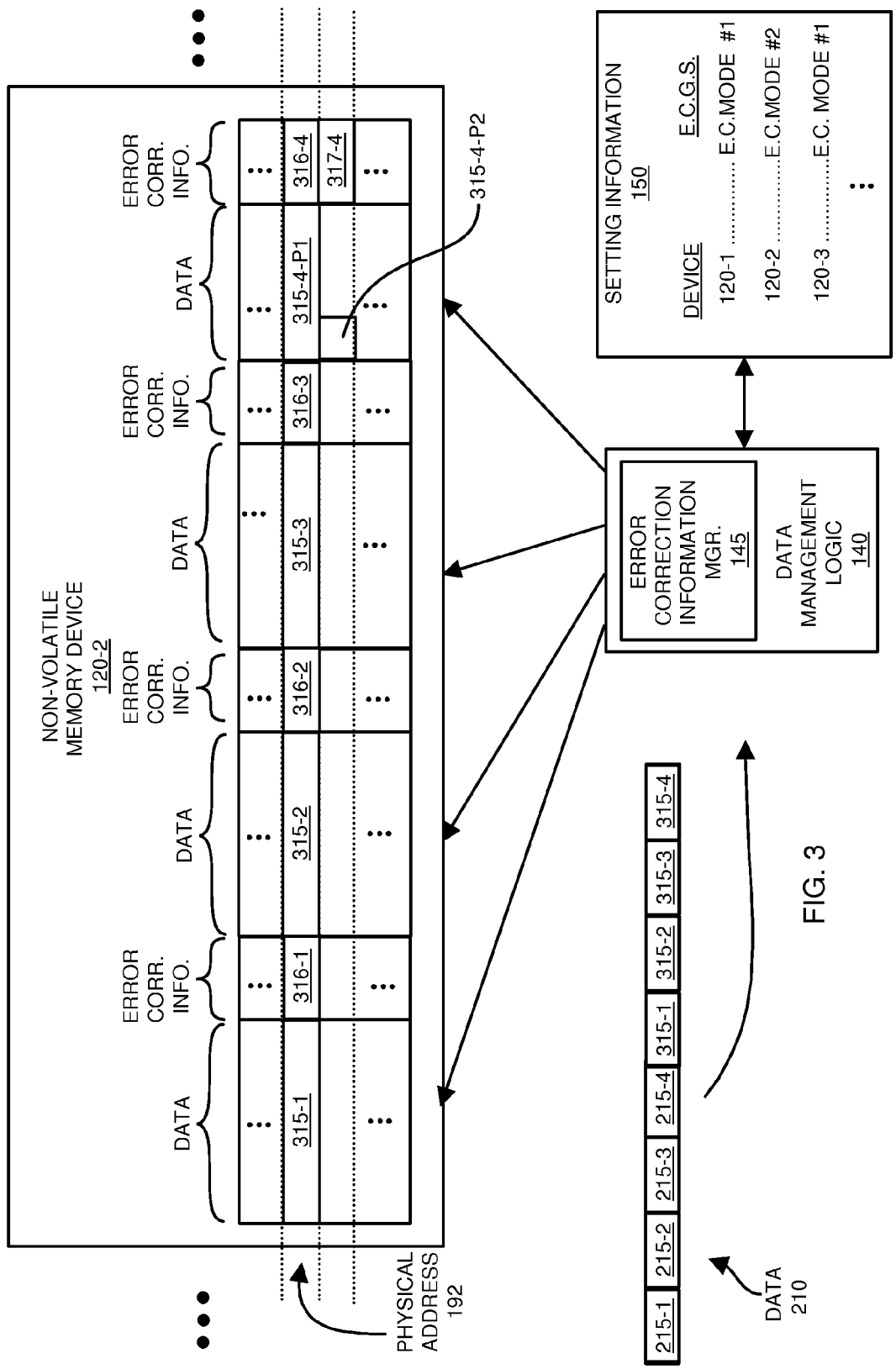
FIG. 3 is an example diagram illustrating storage of data in accordance with a second error correction mode according to embodiments herein.

FIG. 3 is an example diagram illustrating storage of data in accordance with a second error correction mode according to embodiments herein.

As shown, and as previously discussed, data management logic 140 receives data 210 (data string) including multiple bits of data for storage in data storage system 110. Recall that the data management logic 140 partitioned the data 210 into segment 215-1, segment 215-2, segment 215-3, segment 215-4, segment 315-1, segment 315-2, segment 315-3, in segment 315-4. As mentioned, each of the segments (portions) can include an equal number of bits. For sake of illustration, each of segments 315 can include 4096 bytes of information for storage in corresponding storage cells of memory device 120-2.

To proceed with storage of segments 315 in memory device 120-2, the error correction information manager 145 determines from settings information 150 that memory device 120-2 is assigned the second error correction mode (as opposed to the first error correction mode as discussed above).

In response to detecting that the segment 315-1 is destined for storage in the first non-volatile memory device 120-2, the error correction information manager 145 derives error correction information 316-1 from the segment 315-1 in accordance with the second ratio as specified by the second error correction mode. In this non-limiting example embodiment, assume that the second ratio equals 0.2104 (such as 3232 bytes of error correction information per 15,360 bytes of stored data). The second error correction mode requires generation of a higher number of bits of error correction information for corresponding amounts of stored data.

Subsequent to generating error correction information 316-1 (such as 808 bytes of data in this example), the data management logic 140 initiates storage of the segment 315-1 (such as 4096 bytes) and corresponding generated error correction information 316-1 (such as 808 bytes) in memory device 120-2 at physical address 192 as shown.

Accordingly, embodiments herein include utilizing a second length error correction code (such as 808 bytes) as specified by the second error correction mode to generate and store error correction information for data stored in a region of storage cells in the non-volatile memory device 120-2.

The data management logic 140 repeats the process of generating error correction information for each segment of data. For example, in a similar manner as discussed above, the error correction information manager 145 produces error correction information 316-2 based on segment 315-2. As shown, the data management logic 140 initiates storage of the segment 315-2 (such as 4096 bytes) and corresponding error correction information 316-2 (such as 808 bytes) in a next contiguous portion of the page at physical address 192 of memory device 120-2.

The error correction information manager 145 produces error correction information 316-3 based on segment 315-3. As shown, the data management logic 140 initiates storage of the segment 315-3 (such as 4096 bytes) and corresponding error correction information 316-3 (such as 808 bytes) in a next contiguous portion of the page at physical address 192 of memory device 120-2.

Because the second error correction mode includes generating a greater number of bits for error correction information, the data management logic 140 is able to store only a portion of segment 315-4 at physical address 192. In other words, in accordance with the second error correction mode, more bits in a respective available page (such as a page of limited size such as 18,592 bytes) are used to store generated error correction information as opposed to received data. If the first error correction mode is acceptable, it is desired over the second error correction mode because more storage cells are available to store data as opposed to error correction information.

Figure 4:
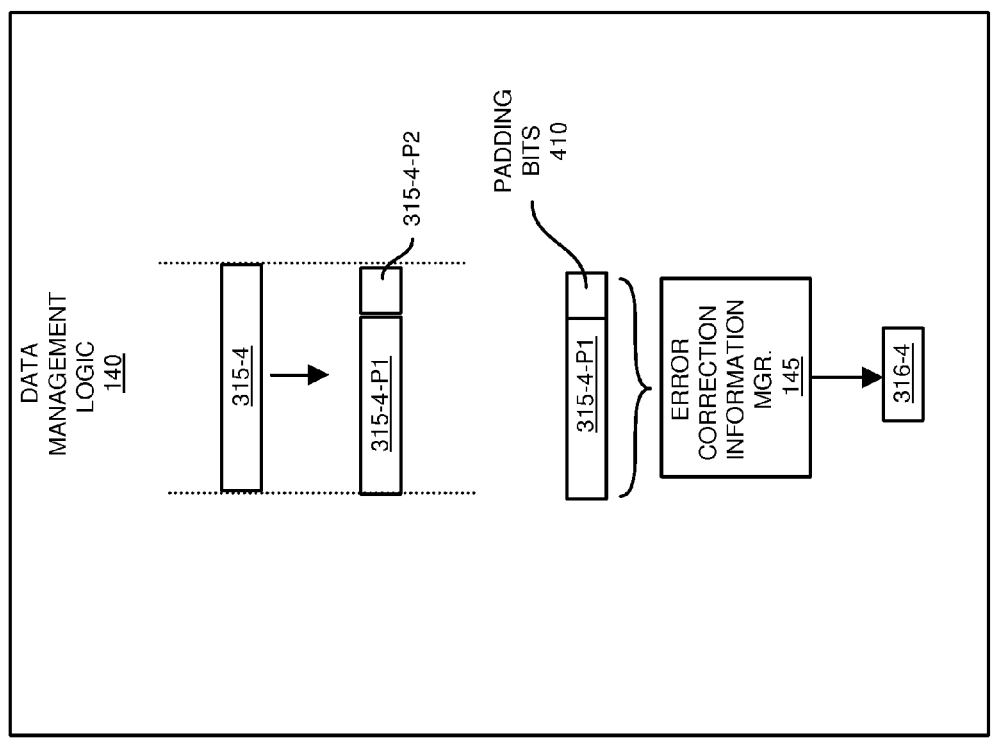
FIG. 4 is an example block diagram of data management logic and generation of error correction information according to embodiments herein.

As a more specific example associated with FIG. 3, as shown in FIG. 4, the data management logic 140 divides segment 315-4 into segment 315-4-P1 and segment 315-4-P2. The data management logic 140 concatenates padding bits 410 (such as 1024 bytes of a predetermined bit pattern) onto segment 315-4-P1. Error correction information manager 145 processes the combination of the segment 315-4-P1 and padding bits 410 to produce corresponding error correction information 316-4 (such as 808 bytes of data).

Referring again to FIG. 3, the data management logic 140 initiates storage of the segment 315-4-P1 (such as 3072 bytes of data) and corresponding error correction information 316-4 (such as 808 bytes) in a next contiguous portion of the page at physical address 192 as shown.

By further way of non-limiting example, the segment 315-4-P2 can be stored at any suitable storage location. Recall that generating a higher amount of error correction information per page reduces an amount of space available to store data. In one embodiment, the data management logic 140 stores the segment 315-4-P2 in a next page of memory device 120-2. As shown, corresponding error correction information for segment 315-4-P2 is stored as error correction information 317-4.

In this manner, the data management logic 140 stores data 210 as a stripe of data across multiple memory devices. As specified by settings information 150, different error correction modes can be assigned to different portions of data storage system 110. Use of the first error correction mode when possible (as opposed to using the second error correction mode) reduces a WRITE amplification that otherwise occurs when writing smaller segments of data. In other words, the availability of larger portions of contiguous storage cells (4096 byte sequence as opposed to 3076 byte sequences) to write corresponding data is desired because, in general, fewer writes are needed store a sequence of data.

Thus, in accordance with the first error correction mode and the first ratio of storing segments as previously discussed in FIG. 2, for the respective page (such as a predetermined size of 18,592 bytes) at physical address 192 in memory device 120-1, the data management logic 140 allocates a first percentage of the corresponding storage cells in the respective page to store corresponding bits of error correction information (2208 bytes/[16,384 bytes+2208 bytes]=11.88%).

In accordance with the second error correction mode and second ratio of storing segments as previously discussed in FIG. 3, for the respective page (such as a predetermined size of 18,592 bytes) at physical address 192 in memory device 120-2, the data management logic 140 allocates a second percentage of the storage cells in the respective page to store corresponding bits of error correction information (3232 bytes/[16,384 bytes+2208 bytes]=17.39%).

As previously discussed, a greater number of bits of error correction information is used to correct the occurrence of higher bit error rates of storing data in memory device 120-2.

In one embodiment, when the data management logic 140 reads the page of data stored at physical address 192 of the memory device 120-2, the data management logic 140 accesses settings information 150 to determine which of multiple error correction modes was used to store corresponding data and error correction information.

In this example embodiment, when reading from memory device 120-2, the data management logic learns based on settings information 150 that the memory device 120-2 is assigned the second error correction mode. In accordance with the second error correction mode, the error correction information manager 145 retrieves the segment 315-1 and error correction information 316-1. Using the retrieved error correction information 316-1, the error correction information manager 145 determines which if any bits in segment 315-1 to correct. In a similar manner, using appropriate stored error correction information, the error correction information manager 145 is able to retrieve and verify accuracy of each retrieved segment from memory device 120-2.

Figure 5:
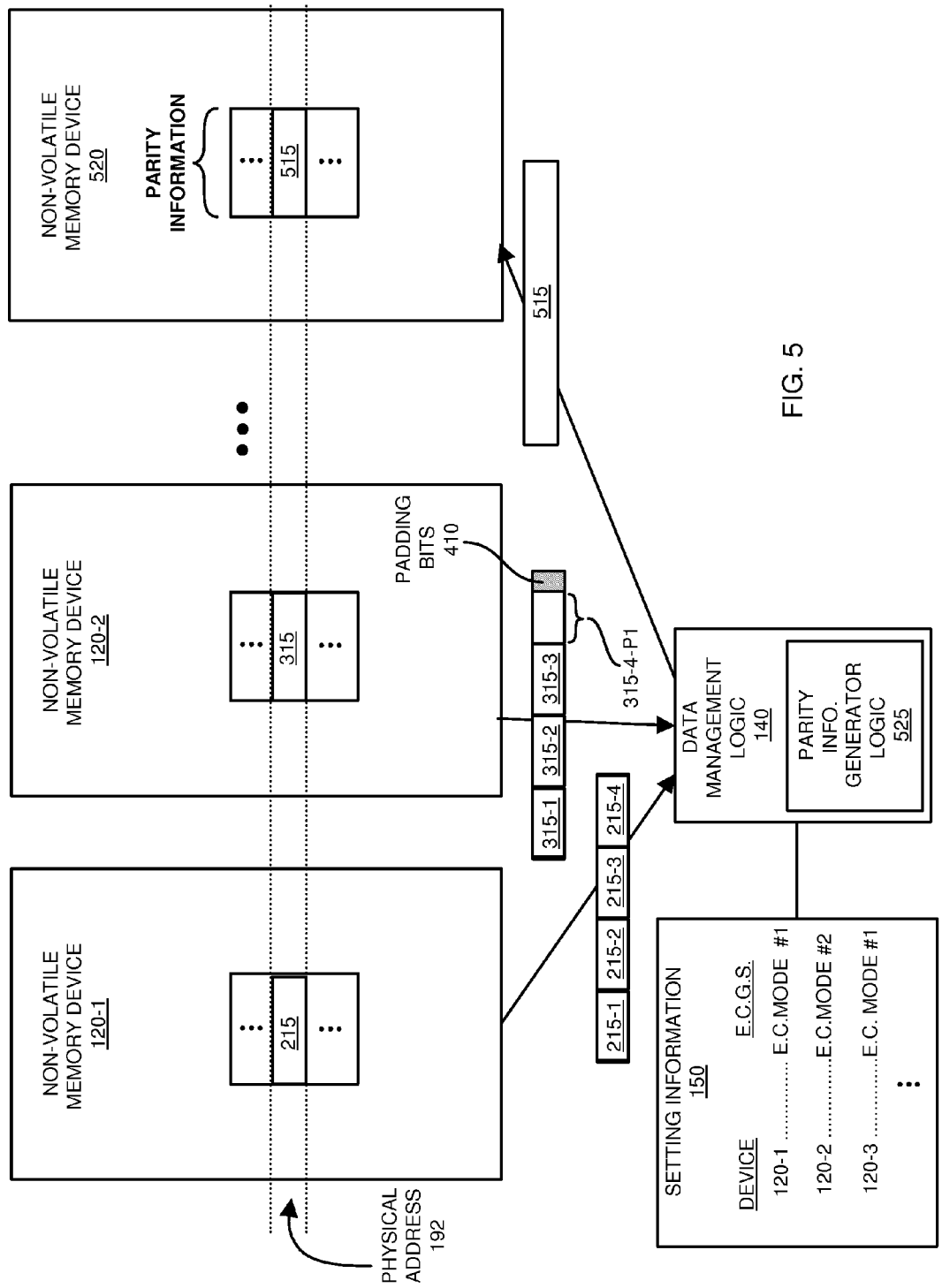
FIG. 5 is an example block diagram illustrating generation of parity information for striped data stored across multiple memory devices in a memory system according to embodiments herein.

FIG. 5 is an example block diagram illustrating generation of parity information for striped data stored in a corresponding memory system according to embodiments herein.

As shown, the data management logic 140 can be configured to generate parity information 515 for a stripe of data stored across multiple memory devices.

For example, in one embodiment, the parity information generator logic 525 of data management logic 140 generates parity information based at least in part on: segments 215 (such as segment 215-1, 215-2, 215-3, and 215-4) stored in a corresponding page at physical address 192 of memory device 120-1, segments 315 (such as segment 315-1, 315-2, 315-3, 315-4-P1, and padding bits 410), and so on, across the entire sequence of memory devices 120 that stores corresponding data.

As shown, parity information generator logic 525 uses the data stored across multiple memory devices 120 to produce parity information 515. In one embodiment, the parity information generator logic 525 implements appropriate logic to perform an exclusive OR (XOR) operation on pages of data stored in each of the memory devices 120 to produce a corresponding page of parity information 515.

In this non-limiting example embodiment, the memory device 520 is configured to store a corresponding page of generated parity information 520. In a similar manner, the parity information generator logic 515 generates corresponding parity information for each row of pages across multiple memory devices 120. The generated path information 515 can be used in a reverse manner to identify occurrence of parity errors.

Figure 6:
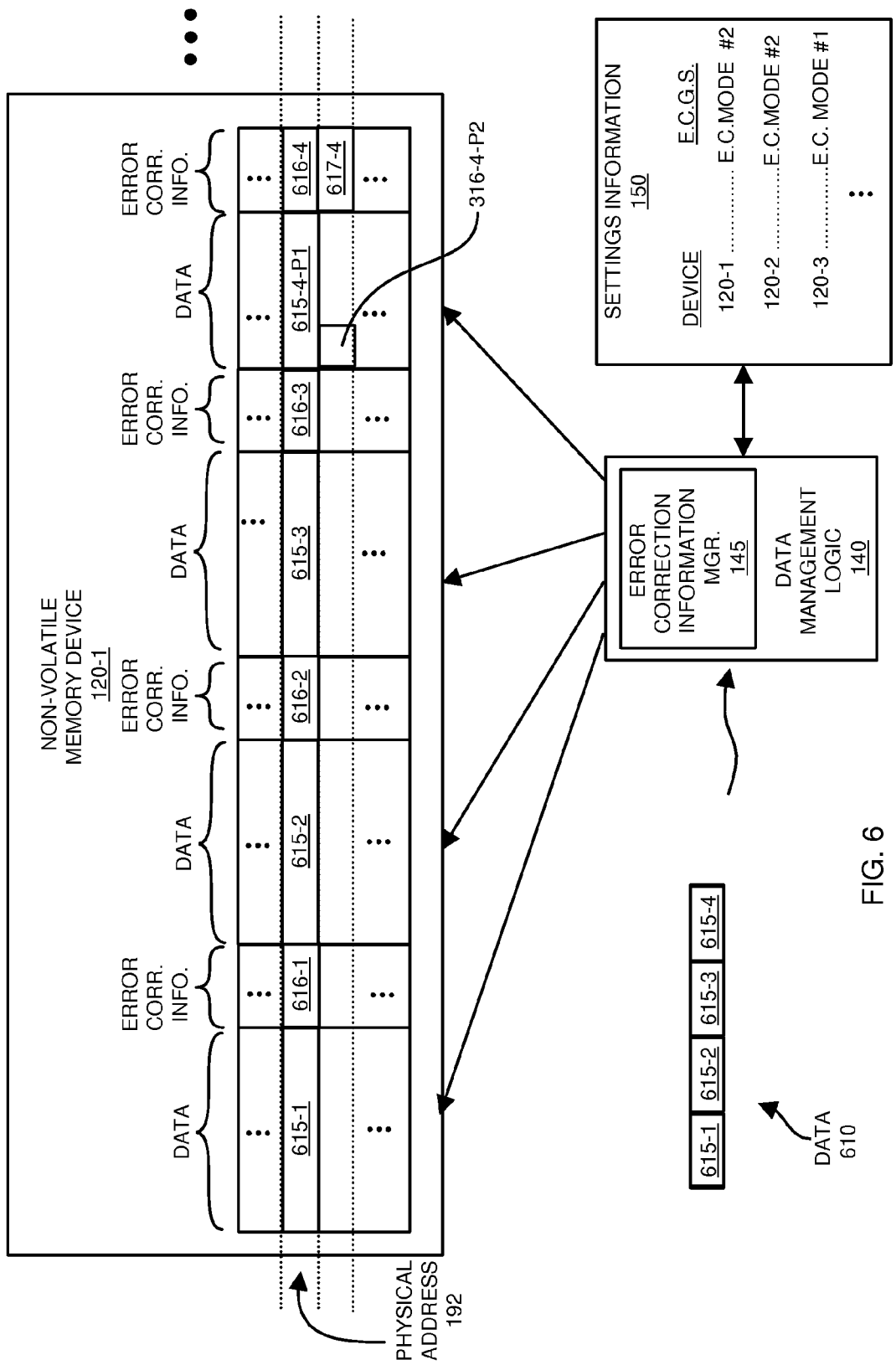
FIG. 6 is an example block diagram illustrating switchover to and implementation of a second error correction mode during a life of a data storage system according to embodiments herein.

FIG. 6 is an example block diagram illustrating switchover to and implementation of a second error correction mode according to embodiments herein.

As previously discussed, monitor logic 125 can be configured to monitor an ability of the storage cells in data storage system 110 over its useful to store corresponding data without errors. Assume in this example embodiment, that the bit error rate of storing and reading back corresponding data in memory device 120-1 increases above a threshold value (such as more than 1%) due to aging and/or repeated ERASE/WRITES to the memory device 120-1 to store data. In such an instance, the mode selection logic 135 updates settings information 150 to assign memory device 120-1 the second error correction mode in lieu of the first error correction mode.

As previously discussed, one way of determining which of the multiple error correction modes to assign to a corresponding memory device can include: tracking a number of cycles of erasing and writing data to storage cells in the non-volatile memory device; utilizing the tracked number of ERASE/WRITE cycles to deduce an error rate associated with the storage cells in the portion to store data without error; and assigning the second error correction mode to store data in the storage cells of the memory device 120-1 in lieu of the first error correction mode in response to detecting that the number of cycles is above a threshold value.

Thus, embodiments herein can include initially assigning the first error correction mode to storage cells in the non-volatile memory device 120-1 to produce error correction information for corresponding data stored in the particular non-volatile memory device 120-1. In response to detecting a condition such as that a bit error rate of storing data in the non-volatile memory device 120-1 increases, the mode selection logic 125 assigns the second error correction mode to the storage cells in the memory device 120-1 to produce error correction information.

As shown in this example embodiment, assume that the data management logic 140 receives data 610 (data string) including multiple bits of data for storage in data storage system 110. Data management logic 140 partitions the data 610 into segment 615-1, segment 615-2, segment 615-3, and segment 615-4 for storage in memory device 120-1.

As previously discussed, each of the segments 615 (portions) can include an equal number of bits (such as a 4096 bytes). That is, for sake of illustration, each of segments 615 can include 4096 bytes of information for storage in corresponding storage cells of memory device 120-1.

To proceed with storage of segments 615 in memory device 120-1, the error correction information manager 145 determines from settings information 150 that memory device 120-1 is assigned the second error correction mode.

In response to detecting that the segment 615-1 is destined for storage in the non-volatile memory device 120-1, the error correction information manager 145 derives error correction information 616-1 from the segment 615-1 in accordance with the second ratio as specified by the second error correction mode. In this non-limiting example embodiment, assume that the second ratio equals 0.2104 (such as 3232 bytes of error correction information per 15,360 bytes of stored data).

Subsequent to generating error correction information 616-1 (such as 808 bytes of data), the data management logic 140 initiates storage of the segment 615-1 (such as 4096 bytes) and corresponding generated error correction information 616-1 (such as 808 bytes) in memory device 120-1 at physical address 192 as shown.

Accordingly, embodiments herein include utilizing a second length error correction code (such as 808 bytes) as specified by the second error correction mode to generate and store error correction information for data stored in a region of storage cells in the non-volatile memory device 120-1.

In a manner as previously discussed, the data management logic 140 repeats the process of generating error correction information for each segment of data. For example, in a similar manner as discussed above, the error correction information manager 145 produces error correction information 616-2 based on segment 615-2. As shown, the data management logic 140 initiates storage of the segment 615-2 (such as 4096 bytes) and corresponding error correction information 616-2 (such as 808 bytes) in a next contiguous portion of the page at physical address 192 of memory device 120-1.

The error correction information manager 145 produces error correction information 616-3 based on segment 615-3. As shown, the data management logic 140 initiates storage of the segment 615-3 (such as 4096 bytes) and corresponding error correction information 616-3 (such as 808 bytes) in a next contiguous portion of the page at physical address 192 of memory device 120-1.

Because the second error correction mode includes generating a greater number of bits for error correction information, the data management logic 140 is able to store only a portion of segment 615-4 at physical address 192. In other words, in accordance with the second error correction mode, more bits (such as 1024 bits) in a respective available page (such as a page of limited size such as 18,592 bytes) are used to store generated error correction information as opposed received data.

As a more specific example, the data management logic 140 divides segment 615-4 into segment 615-4-P1 and segment 615-4-P2. The data management logic 140 concatenates padding bits 410 (such as 1024 bytes of a predetermined bit pattern) onto segment 615-4-P1. Error correction information manager 145 processes the combination of the segment 615-4-P1 and padding bits 410 to produce corresponding error correction information 616-4 (such as 808 bytes of data).

The data management logic 140 initiates storage of the segment 615-4-P1 (such as 3072 bytes of data) and corresponding error correction information 616-4 (such as 808 bytes) in a next contiguous portion of the page at physical address 192 as shown.

By way of non-limiting example, the segment 615-4-P2 can be stored at any suitable storage location. Recall that generating a higher amount of error correction information per page reduces an amount of space available to store data. In general, smaller available portions (e.g., 3076 bytes versus 4096 bytes) increase an amount of WRITEs of data to the data storage system 110. In one embodiment, the data management logic 140 stores the segment 615-4-P2 in a next page of memory device 120-1. Corresponding error correction information for segment 615-4-P2 is stored as error correction information 617-4.

As previously discussed, a greater number of bits of error correction information is used to correct the occurrence of higher bit error rates of storing data in memory device 120-1.

FIG. 7 is an example diagram of settings information specifying different error correction modes according to embodiments herein.

In this example embodiment, the settings information 150-2 indicates different portions of storage cells in data storage system 110 and assignment of error correction modes. Settings information 150-2 can indicate any suitable subdivision of storage cells and a corresponding assignment of a respective error correction mode.

As shown in this example embodiment, a first sub-portion of storage cells in memory device 120-1 (such as pages 1 through 256) is assigned a first error correction mode; the second sub-portion of storage cells in memory device 120-1 (such as pages 257 through 512) is assigned a second error correction mode; and so on.

In accordance with one embodiment, a respective memory device in data storage system 110 can be a Multi-Level Cell (MLC) NAND memory device. Upper pages of the MLC memory device can be assigned to generate corresponding error correction information for data in accordance with a first error correction mode; lower pages of the MLC memory device can be assigned to generate corresponding error correction information for data in accordance with a second error correction mode.

Figure 8:
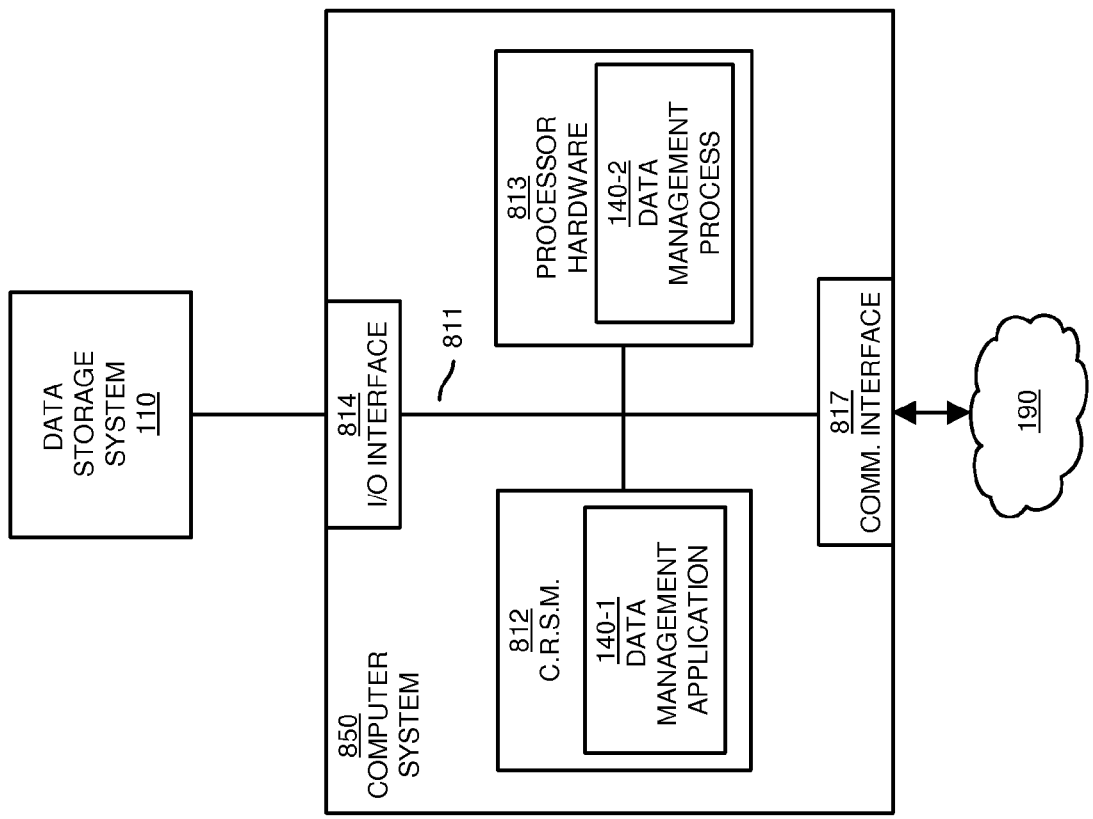
FIG. 8 is an example computer architecture including computer processor hardware to execute instructions to carry out any of the operations as described herein.

FIG. 8 is an example computer architecture including computer processor hardware according to embodiments herein.

Computer system 850 can be configured to execute any of the operations as discussed herein.

As shown, computer system 850 of the present example can include an interconnect 811 that couples computer readable storage media 812 such as a physical non-transitory type of media (i.e., any type of physical hardware storage medium) in which digital information can be stored and retrieved, computer processor hardware 813 (i.e., one or more processor devices), I/O interface 814, communications interface 817, etc.

As shown, I/O interface 814 provides computer system 850 connectivity to data stored in data storage system 110.

Computer readable storage medium 812 can be any physical or tangible hardware storage device or devices such as memory, optical storage, hard drive, floppy disk, etc. In one embodiment, the computer readable storage medium 812 (e.g., a computer readable hardware storage) stores instructions and/or data.

Communications interface 817 enables the computer system 850 and respective computer processor hardware 813 (such as computer processor hardware) to communicate over a resource such as network 190 to retrieve information from remote sources and communicate with other computers. I/O interface 814 enables computer processor hardware 813 to retrieve stored information from non-volatile memory resource 110.

As shown, computer readable storage media 812 is encoded with data management application 140-1 (e.g., logic, software, firmware, etc.) executed by computer processor hardware 813. Data management application 140-1 can be configured to include instructions to implement any of the operations as discussed herein.

During operation of one embodiment, computer processor hardware 813 accesses computer readable storage media 812 via the use of interconnect 811 in order to launch, run, execute, interpret or otherwise perform the instructions in data management application 140-1 stored on computer readable storage medium 812.

Execution of the data management application 140-1 produces processing functionality such as data management process 140-2 in computer processor hardware 813. In other words, the data management process 140-2 associated with computer processor hardware 813 represents one or more aspects of executing data management application 140-1 within or upon the processor 813 in the computer system 850.

Those skilled in the art will understand that the computer system 850 can include other processes and/or software and hardware components, such as an operating system that controls allocation and use of hardware resources, software resources, etc., to execute data management application 140-1.

In accordance with different embodiments, note that computer system 850 may be any of various types of devices, including, but not limited to, a mobile computer, a personal computer system, a wireless device, base station, phone device, desktop computer, laptop, notebook, netbook computer, mainframe computer system, handheld computer, workstation, network computer, application server, storage device, a consumer electronics device such as a camera, camcorder, set top box, mobile device, video game console, handheld video game device, a peripheral device such as a switch, modem, router, or in general any type of computing or electronic device.

It is noted that FIG. 8 illustrates an example embodiment of the computer system 850, and that other embodiments of the computer system 850 may include more apparatus components, or fewer apparatus components, than the apparatus components illustrated in FIG. 8. Further, the apparatus components may be arranged differently than as illustrated in FIG. 8. For example, in some embodiments, the data storage system 110 may be located at a remote site accessible to the computer system 850 via the Internet, or any other suitable network. In addition, functions performed by various apparatus components contained in other embodiments of the computer system 850 may be distributed among the respective components differently than as described herein.

Functionality supported by the different resources will now be discussed via flowchart in FIGS. 9 and 10. Note that the processing in the flowcharts below can be executed in any suitable order.

Figure 9:
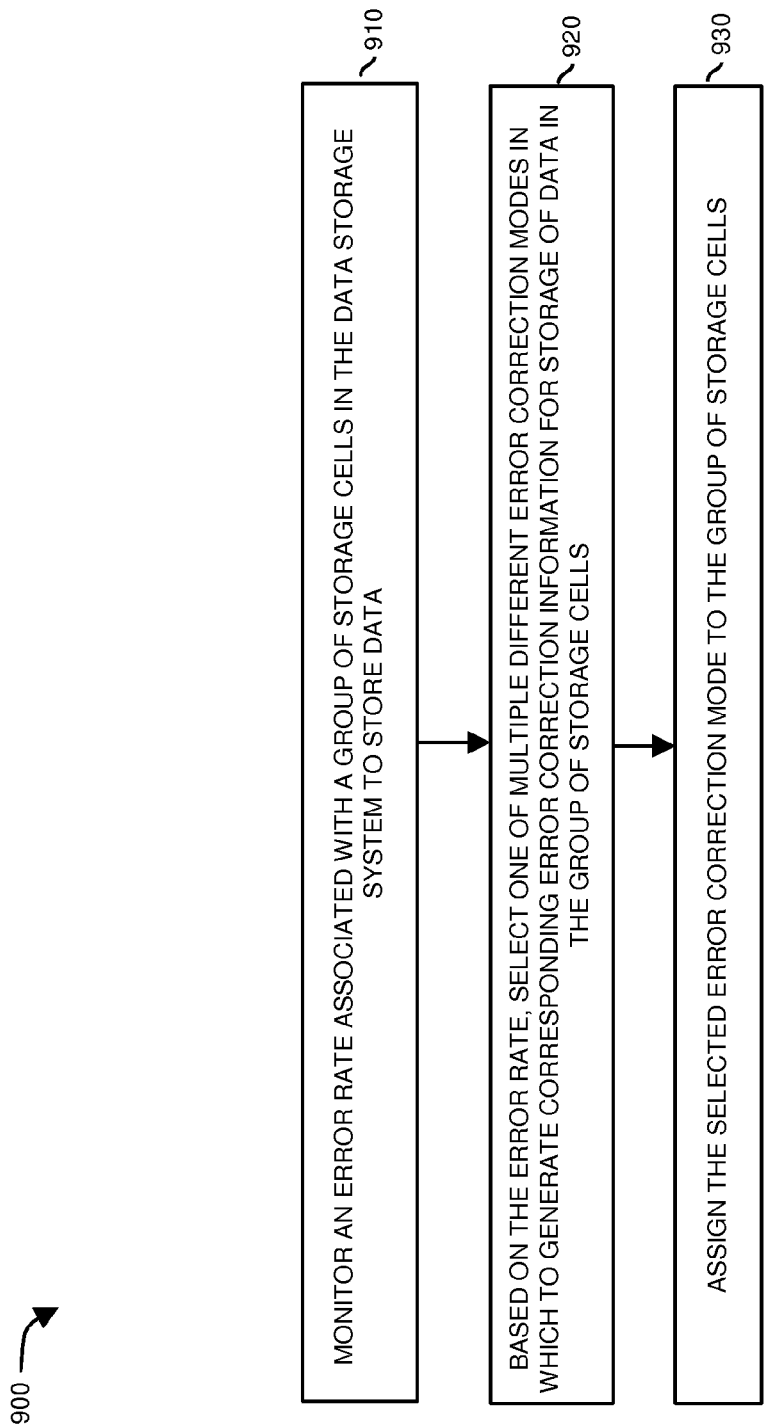
FIG. 9 is a flow diagram illustrating an example method of assigning error correction modes according to embodiments herein.

FIG. 9 is a flowchart 900 illustrating an example method according to embodiments. Note that there will be some overlap with respect to concepts as discussed above.

In processing operation 910, the monitor logic 125 monitors an error rate associated with a group of storage cells in the data storage system 110 to store data.

In processing operation 920, based on the monitored error rate, the mode selection logic 135 selects one of multiple different error correction modes in which to generate corresponding error correction information for storage of data in the group of storage cells.

In processing operation 930 the mode selection logic 135 assigns the selected error correction mode to the group of storage cells.

Figure 10:
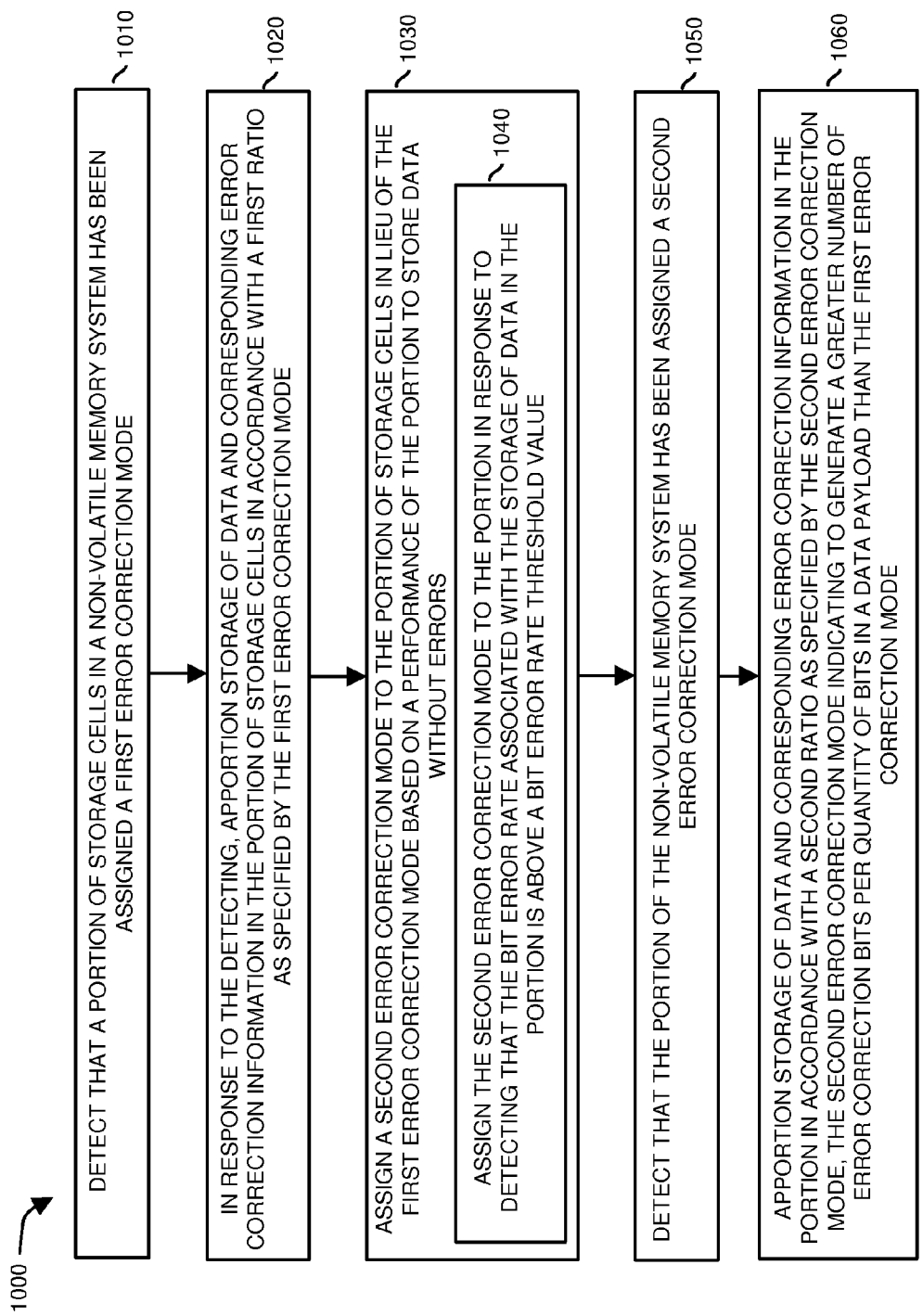
FIG. 10 is a flow diagram illustrating an example method of generating error correction information in accordance with multiple error correction modes according to embodiments herein.

FIG. 10 is a flowchart 1000 illustrating an example method according to embodiments. Note that there will be some overlap with respect to concepts as discussed above.

In processing operation 1010, the data management logic 140 detects that a portion of storage cells in a non-volatile memory system has been assigned a first error correction mode.

In processing operation 1020, in response to the detecting, the data management logic 140 apportions storage of data and corresponding error correction information in the portion of storage cells in accordance with a first ratio as specified by the first error correction mode.

In processing operation 1030, at a later point in time, the mode selection logic 135 assigns a second error correction mode to the portion of storage cells in lieu of the first correction mode based on a performance of the portion to store data. In one embodiment, processing operation 1030 includes processing operation 1040 in which the mode selection logic 135 assigns the second error correction mode to the portion in response to detecting that the bit error rate associated with storage of data in the portion is above a bit error rate threshold value.

In processing operation 1050, the data management logic 140 detects that the portion of the data storage system 110 has been assigned a second error correction mode.

Figure 11:
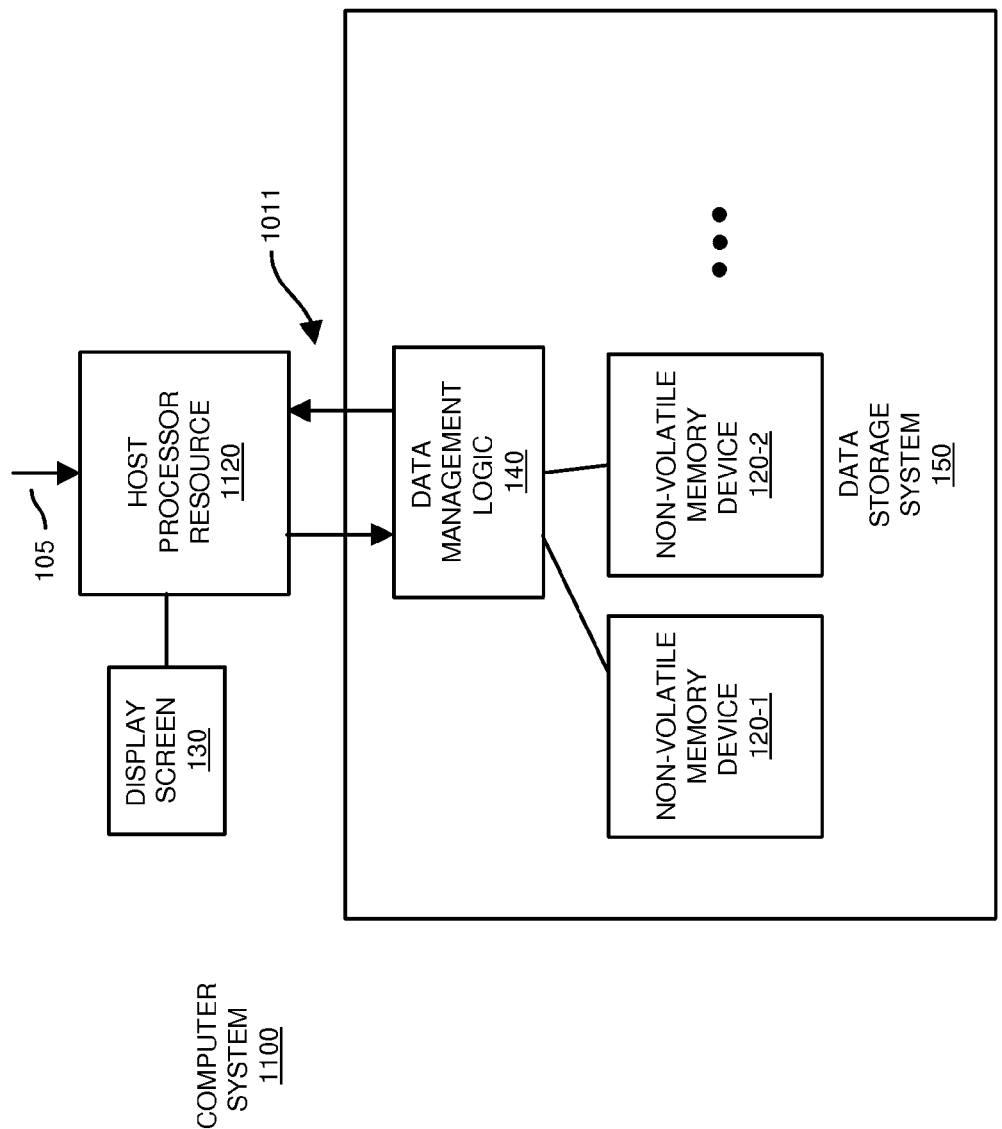
FIG. 11 is an example diagram illustrating a computer system and corresponding display screen including corresponding data management logic according to embodiments herein.

In processing operation 1060, the data management logic 140 apportions storage of data and corresponding error correction information in the portion in accordance with a second ratio as specified by the second error correction mode, the second error correction mode indicating to generate a greater number of error correction bits per quantity of data bits than the first error correction mode FIG. 11 is an example diagram illustrating use of a data storage system in a respective computer system according to embodiments herein.

As shown, computer system 1100 can include a host processor resource 1120 and data storage system 110. Host processor resource 1120 can be or include one or more processor devices. Additionally, computer system 1100 can be any suitable type of resource such as a personal computer, cellular phone, mobile device, camera, etc., using memory system 150 to store data.

By way of a non-limiting example, memory system 150 can be a solid-state drive used to store data.

In one embodiment, host processor resource 1120 has access to memory system 150 via interface 1011. Interface 1011 can be any suitable link enabling data transfers. For example, the interface 1011 can be a SCSI (Small Computer System Interface), SAS (Serial Attached SCSI), SATA (Serial Advanced Technology Attachment), USB (Universal Serial Bus), PCIE (Peripheral Component Interconnect Express) bus, etc.

Via interface 1011, the host processor resource 1120 of computer system 1100 is able to retrieve data from and store data in data storage system 150.

As an example, assume that the host processor resource 1120 receives a request to perform a respective function as specified by input 105 from a user. Host processor resource 1120 executes the function, which can include transmitting a request over interface 1011 to data management logic 140 for retrieval of data at a specified logical address. The data management logic 140 maps the logical address to an appropriate physical address and retrieves the data from non-volatile memory devices 120. Data management logic 140 transmits the retrieved data to host processor resource 1120.

In one non-limiting example embodiment, the host processor resource 1120 initiates display of an image on display screen 130 depending on the data received from the data management logic 140.

As a further example, the host processor resource 1120 can receive a request to perform a respective function as specified by input 105 from a user. Host processor resource 1120 executes the function and communicates with data management logic 140 to store data at a logical address as specified by the host processor resource 1120. In response to receiving the request, the data management logic 140 maps the logical address to an appropriate physical address and stores the received data in a corresponding location of the non-volatile memory devices 120.

The data management logic 140 performs the functions as discussed herein to ensure data integrity. That is, the data management logic 140 utilizes the settings information 150 to identify error correction modes to generate error correction information and recover corrupted data.

Note that no element, operation, or instruction employed herein should be construed as critical or essential to the application unless explicitly described as such. Also, as employed herein, the article "a" is intended to include one or more items. Where only one item is intended, the term "one" or similar language is employed. Further, the phrase "based on" is intended to mean "based, at least in part, on" unless explicitly stated otherwise.

While details have been particularly shown and described with references to preferred embodiments thereof, it will be understood by those skilled in the art that various changes in form and details may be made therein without departing from the spirit and scope of the present application as defined by the appended claims. Such variations are intended to be covered by the scope of this present application. As such, the foregoing description of embodiments of the present application is not intended to be limiting. Rather, any limitations to the embodiments herein are presented in the following claims.

What is claimed is:

1. A method comprising:
   monitoring, over time, an error rate associated with a group of storage cells in a data storage system, the error rate changing over time;
   based on the error rate, dynamically selecting one of multiple different error correction modes in which to generate corresponding error correction information for storage of data in the group of storage cells; and
   assigning the selected error correction mode to the group of storage cells;
   wherein the group of storage cells is a first group of storage cells, the data storage system including the first group of storage cells and a second group of storage cells, the method further comprising:
   assigning a first error correction mode to the first group of storage cells, the first error correction mode specifying a first ratio of generating error correction information for first data to be stored in the first group of storage cells;
   assigning a second error correction mode to the second group of storage cells, the second error correction mode specifying a second ratio of generating error correction information for second data to be stored in the second group of storage cells, the second ratio greater in magnitude than the first ratio;
   receiving a data string including multiple bits of data;
   partitioning the data string to include a first portion of data and a second portion of data;
   in response to detecting that the first portion of data is destined for storage in the first group of storage cells, deriving first error correction information from the first portion of data in accordance with the first ratio; and
   in response to detecting that the second portion of data is destined for storage in the second group of storage cells, deriving second error correction information from the second portion of data in accordance with the second ratio.

2. The method as in claim 1, wherein monitoring the error rate includes:
   initiating repeated storage of different groupings of data to a set of storage cells in a non-volatile memory device in the data storage system, the set of storage cells allocated for testing; and
   verifying an accuracy of the different groupings of data stored in the set of storage cells.

3. The method as in claim 2 further comprising:
   initially assigning the first error correction mode to the first group of storage cells to produce the first error correction information for corresponding data stored in the first group of storage cells; and
   in response to detecting that a bit error rate of storing data in the first group of storage cells increases, assigning a new error correction mode to the first group of storage cells, the new error correction mode different than the first error correction mode.

4. The method as in claim 1 further comprising:
   initiating storage of the first portion of data and the first error correction information in the first group of storage cells; and
   initiating storage of the second portion of data and the second error correction information in the second group of storage cells, a combination of the first portion of data and the second portion of data being part of a stripe of data stored across multiple non-volatile memory devices in the data storage system.

5. The method as in claim 1 further comprising:
   generating parity information based at least in part on the first portion of data and the second portion of data.

6. The method as in claim 1 further comprising:
   determining the error rate based on a number of cycles of writing data to the group of storage cells.

7. The method as in claim 1 further comprising:
   utilizing a first length error correction code as specified by the first error correction mode to generate the first error correction information for the first portion of data, the first portion of data stored in a first region of storage cells in a particular non-volatile memory device in the data storage system; and
   utilizing a second length error correction code as specified by the second error correction mode to generate the second error correction information for the second portion of data, the second portion of data stored in a second region of storage cells in the particular non-volatile memory device.

8. A method comprising:
   in response to detecting that a portion of a non-volatile memory system has been assigned a first error correction mode, apportioning storage of a first group of data and corresponding first error correction information in the portion of the non-volatile memory system in accordance with a first ratio as specified by the first error correction mode; and in response to detecting that the portion of the non-volatile memory system has been assigned a second error correction mode, apportioning storage of a second group of data and corresponding second error correction information in the portion of the non-volatile memory system in accordance with a second ratio as specified by the second error correction mode;

the method further comprising:

tracking a number of cycles of writing data to storage cells in the portion of the non-volatile memory system;

utilizing the number of cycles as a basis to determine an error rate associated with the storage cells in the portion of the non-volatile memory system to store the data without errors; and assigning the second error correction mode to store subsequent received data in the storage cells in lieu of the first error correction mode in response to detecting that the number of cycles is above a threshold value.

9. The method as in claim 8 further comprising:

assigning the second error correction mode to the portion of the non-volatile memory system in lieu of the first error correction mode in response to detecting that a bit error rate associated with the storage of data in the portion is above a bit error rate threshold value.

10. The method as in claim 9, wherein the second error correction mode generates a greater number of error correction bits per quantity of bits in a data payload than the first error correction mode.

11. The method as in claim 8, wherein the apportioning storage in accordance with the first ratio includes: for a respective page in the portion of the non-volatile memory system, allocating a first percentage of storage cells in the respective page to store corresponding first bits of error correction information; and wherein the apportioning storage in accordance with the second ratio includes: for the respective page in the portion of the non-volatile memory system, allocating a second percentage of the storage cells in the respective page to store corresponding second bits of error correction information.

12. The method as in claim 8, wherein the portion includes a first set of pages and a second set of pages in a non-volatile memory device of the non-volatile memory system;

wherein the first set of pages in the portion of the non-volatile memory system are assigned the first error correction mode; and wherein the second set of pages in the portion of the non-volatile memory system are assigned the second error correction mode.

13. An apparatus comprising:

monitor logic operable to dynamically determine, over time, an error rate associated with a group of storage cells in a data storage system;

mode selection logic operable to select, based on the error rate, an error correction mode amongst multiple different error correction modes in which to generate corresponding error correction information for storage of data in the group of storage cells; and a storage resource, the storage resource operable to store settings information tracking assignment of the selected error correction mode to the group of storage cells;

wherein the group of storage cells is a first group of storage cells, the data storage system including the first group of storage cells and a second group of storage cells;

wherein the mode selection logic is operable to assign a first error correction mode to the first group of storage cells, the first error correction mode specifying a first ratio of generating error correction information for first data to be stored in the first group of storage cells;

wherein the mode selection logic is operable to assign a second error correction mode to the second group of storage cells, the second error correction mode specifying a second ratio of generating error correction information for second data to be stored in the second group of storage cells, the second ratio greater in magnitude than the first ratio;

the apparatus further comprising data management logic operable to:

receive a data string including multiple bits of data;

partition the data string to include a first portion of data and a second portion of data;

in response to detection that the first portion of data is destined for storage in the first group of storage cells, derive first error correction information from the first portion of data in accordance with the first ratio; and in response to detection that the second portion of data is destined for storage in the second group of storage cells, derive second error correction information from the second portion of data in accordance with the second ratio.

14. The apparatus as in claim 13, wherein the data management logic is further operable to:

initiate repeated storage of data to a set of storage cells in a particular non-volatile memory device in which the first group of storage cells resides, the non-volatile memory device residing in the data storage system; and wherein the monitor logic keeps track of a bit error rate associated with the set of storage cells.

15. The apparatus as in claim 14, wherein the mode selection logic is operable to initially assign the first error correction mode to the first group of storage cells to produce first error correction information for a first set of corresponding data stored in the first group of storage cells; and wherein the mode selection logic is operable to, in response to detection that a bit error rate of storing additional data in the first group of storage cells increases, assign a new error correction mode to the first group of storage cells, the new error correction mode different than the first error correction mode.

16. A computer system including the apparatus as in claim 13, the computer system comprising:

a host processor resource to process the data stored in the data storage system.

17. The computer system as in claim 16 further comprising:

a display screen on which to render an image based on the data stored in the data storage system.

18. Computer-readable storage hardware having instructions stored thereon, the instructions, when carried out by computer processor hardware, cause the computer processor hardware to perform operations of:

monitoring an error rate associated with a group of storage cells in a data storage system;

based on the error rate, selecting one of multiple different error correction modes in which to generate corresponding error correction information for storage of data in the group of storage cells; and assigning the selected error correction mode to the group of storage cells;

wherein the group of storage cells is a first group of storage cells, the data storage system including the first group of storage cells and a second group of storage cells, the computer processor hardware further operable to perform operations of:

assigning a first error correction mode to the first group of storage cells, the first error correction mode specifying a first ratio of generating error correction information for first data to be stored in the first group of storage cells;

assigning a second error correction mode to the second group of storage cells, the second error correction mode specifying a second ratio of generating error correction information for second data to be stored in the second group of storage cells, the second ratio greater in magnitude than the first ratio;

receiving a data string including multiple bits of data;

partitioning the data string to include a first portion of data and a second portion of data;

in response to detecting that the first portion of data is destined for storage in the first group of storage cells, deriving first error correction information from the first portion of data in accordance with the first ratio; and in response to detecting that the second portion of data is destined for storage in the second group of storage cells, deriving second error correction information from the second portion of data in accordance with the second ratio.

19. The computer-readable storage hardware as in claim 18, wherein the instructions further cause the computer processor hardware to perform operations of:

initially assigning the first error correction mode to the first group of storage cells to produce first error correction information for the first portion of data that is stored in the first group of storage cells; and in response to detecting that a bit error rate of storing data in the first group of storage cells increases, assigning a new error correction mode to the group of storage cells, the new error correction mode different than the first error correction mode.

20. The method as in claim 1, wherein the first portion of data and the second portion of data include an equal number of bits.

21. The method as in claim 2, wherein the first group of storage cells is resident within the non-volatile memory device;

wherein the first group of storage cells is different than the set of storage cells; and wherein assigning the first error correction mode to the first group of storage cells includes: assigning the first error correction mode to the first group of storage cells based on the accuracy.

22. The method as in claim 8 further comprising:

assigning a new error correction mode to the first groups of storage cells depending on a magnitude of a detected number of cycles of writing to the first group of storage cells.

* * * * *